United States Patent
Elias et al.

(10) Patent No.: US 6,621,702 B2
(45) Date of Patent: Sep. 16, 2003

(54) METHOD AND APPARATUS FOR ABSORBING THERMAL ENERGY

(75) Inventors: J. Michael Elias, Orlando, FL (US); Bruce M. Cepas, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/166,202

(22) Filed: Jun. 11, 2002

(65) Prior Publication Data

US 2003/0142477 A1 Jul. 31, 2003

Related U.S. Application Data

(60) Provisional application No. 60/350,924, filed on Jan. 25, 2002.

(51) Int. Cl.$^7$ ................................................ H05K 7/20
(52) U.S. Cl. .................. 361/700; 165/104.33; 361/690; 361/679; 361/708; 361/715; 174/15.1
(58) Field of Search .......................... 165/80.3, 45, 10, 165/104.32, 104.33; 174/16.3, 15.1, 15.2; 361/688, 690, 600, 679, 687, 704–710, 715, 818

(56) References Cited

U.S. PATENT DOCUMENTS

| | | | |
|---|---|---|---|
| 4,047,198 A | * | 9/1977 | Sekhon et al. ............. 174/16.3 |
| 4,739,448 A | | 4/1988 | Rowe et al. |
| 5,007,478 A | * | 4/1991 | Sengupta ..................... 165/10 |
| 5,128,689 A | | 7/1992 | Wong et al. |
| 5,224,356 A | * | 7/1993 | Colvin et al. .............. 174/15.2 |
| 5,353,498 A | | 10/1994 | Fillion et al. |
| 5,366,801 A | | 11/1994 | Bryant et al. |
| 5,424,519 A | | 6/1995 | Salee |
| 5,567,544 A | | 10/1996 | Lyman |
| 5,629,838 A | | 5/1997 | Knight et al. |
| 5,630,961 A | | 5/1997 | Salee |
| 5,793,603 A | | 8/1998 | Lyman |
| 5,804,297 A | | 9/1998 | Colvin et al. |
| 5,851,338 A | | 12/1998 | Pushaw |

(List continued on next page.)

OTHER PUBLICATIONS

Cepas et al., U.S. patent application Ser. No. 09/974,033, entitled "Integrally Formed Energy Storage Device and Method of Fabrication" filed Oct. 10, 2001.

Elias et al., U.S. patent application Ser. No. 10/107,177, entitled "Integrated Power and Cooling Architecture" filed Mar. 28, 2002.

Primary Examiner—Gregory Thompson
(74) Attorney, Agent, or Firm—Burns, Doane, Swecker & Mathis, LLP

(57) ABSTRACT

An apparatus for absorbing thermal energy has an electronic component, a support structure for the electronic component having a first set of surfaces defining an interior volume containing a plurality of secondary surfaces, and a thermal energy absorbing material integrated within the interior volume, in contact with at least a portion of the secondary surfaces to form a composite structure. The thermal energy absorbing material is in operative thermal communication with the electronic component such that at least a portion of the thermal energy generated by the electronic component flows, via the support structure, into the thermal energy absorbing material. A method for controlling a temperature of an electronic component mounts an electronic component on a support structure in thermal communication with a thermal energy absorbing material integrated into an interior volume of the support structure. At least a portion of a thermal load from the electronic component is transported to the thermal energy absorbing material, and the portion of the thermal load is absorbed with the thermal energy absorbing material while undergoing an endothermic reaction during a phase change of the material, such that a temperature of the electronic component is maintained below a mounting surface temperature.

21 Claims, 2 Drawing Sheets

U.S. PATENT DOCUMENTS

| | | | |
|---|---|---|---|
| 5,955,188 A | 9/1999 | Pushaw | |
| 6,037,032 A | 3/2000 | Klett et al. | |
| 6,073,684 A * | 6/2000 | Fiechter et al. | 361/700 |
| 6,076,595 A * | 6/2000 | Austin et al. | 361/700 |
| 6,077,597 A | 6/2000 | Pause | |
| 6,099,894 A | 8/2000 | Holman | |
| 6,111,192 A * | 8/2000 | Bell et al. | 361/818 |
| 6,169,247 B1 * | 1/2001 | Craft, Jr. et al. | 361/700 |
| 6,171,647 B1 | 1/2001 | Holman | |
| 6,181,558 B1 | 1/2001 | Gordon | |
| 6,202,739 B1 | 3/2001 | Pal et al. | |
| 6,208,254 B1 | 3/2001 | McQueen et al. | |
| 6,212,074 B1 | 4/2001 | Gonsalves et al. | |
| 6,219,218 B1 | 4/2001 | Nial, Jr. et al. | |
| 6,226,173 B1 | 5/2001 | Welsch et al. | |
| 6,239,502 B1 | 5/2001 | Grewe et al. | |
| 6,261,871 B1 | 7/2001 | Langari et al. | |
| 6,270,836 B1 | 8/2001 | Holman | |
| 6,297,775 B1 | 10/2001 | Haws et al. | |
| 6,300,564 B1 | 10/2001 | Moraes et al. | |
| 6,317,321 B1 * | 11/2001 | Fitch et al. | 361/700 |
| 6,341,056 B1 | 1/2002 | Allman et al. | |
| 6,418,017 B1 * | 7/2002 | Patel et al. | 361/700 |
| 6,477,035 B1 | 11/2002 | Cepas et al. | |

* cited by examiner

METHOD AND APPARATUS FOR ABSORBING THERMAL ENERGY

This application claims priority under 35 U.S.C. §119(e) to U.S. Provisional Application No. 60/350,924 entitled INTEGRATED POWER AND COOLING ARCHITECTURE and filed on Jan. 25, 2002, the entire content of which is hereby incorporated by reference.

BACKGROUND

1. Field of Invention

The present invention relates generally to absorbing thermal energy to cool to a thermal load, such as thermal energy generated by electronic components.

2. Background Information

Electronics, such as RF sensor transmit/receive (T/R) units, can be relatively inefficient (15–25%) at converting electrical energy to radiated power and as a result generate waste heat. If there is insufficient thermal mass to absorb this waste heat, mounting surface and junction temperatures of electronic components can rise with consequent component failure. Additionally, waste heat in general can contribute to degradation of materials resulting in reduced lifetime and device failure. Moreover, thermal management solutions can limit device miniaturization.

SUMMARY

The present invention is directed to an apparatus for absorbing thermal energy. In an exemplary embodiment, an apparatus for absorbing thermal energy has an electronic component, a support structure for the electronic component having a first set of surfaces defining an interior volume containing a plurality of secondary surfaces, and a thermal energy absorbing material integrated within the interior volume, in contact with at least a portion of the secondary surfaces to form a composite structure. The thermal energy absorbing material is in operative thermal communication with the electronic component such that at least a portion of the thermal energy generated by the electronic component flows, via the support structure, into the thermal energy absorbing material.

Exemplary methods are disclosed for controlling a temperature of an electronic component, wherein an electronic component is mounted on a support structure in thermal communication with a thermal energy absorbing material integrated into an interior volume of the support structure, at least a portion of a thermal load from the electronic component is transported to the thermal energy absorbing material, and the portion of the thermal load is absorbed with the thermal energy absorbing material while undergoing an endothermic reaction during a phase change of the material, such that a temperature of the electronic component is maintained below a mounting surface temperature.

In an exemplary embodiment, the thermal energy absorbing material can be selected to have a phase change temperature less than the mounting surface temperature.

BRIEF DESCRIPTION OF THE DRAWING FIGURES

Objects and advantages of the invention will become apparent from the following detailed description of preferred embodiments in connection with the accompanying drawings, in which like numerals designate like elements and in which.

DETAILED DESCRIPTION OF THE PREFERRED EMBODIMENTS

Figure 1:
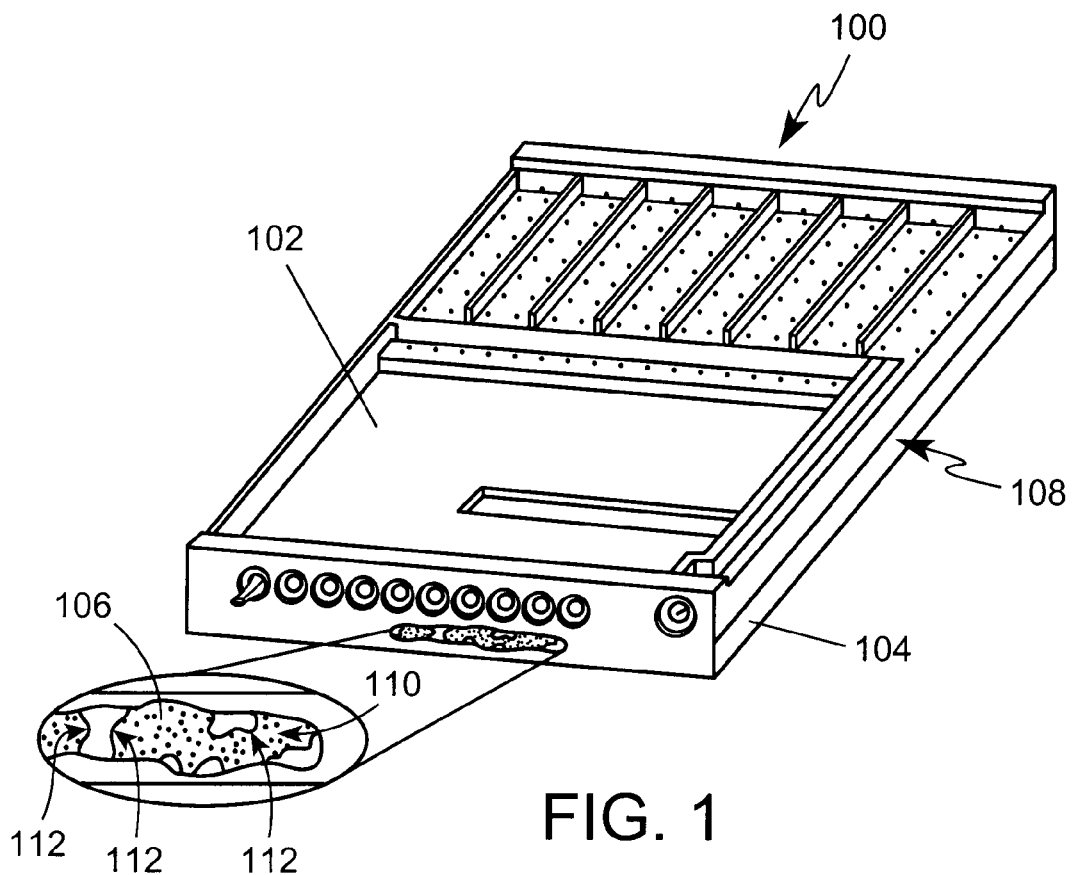
FIG. 1 is an exemplary embodiment of an apparatus for absorbing thermal energy.

The present invention is directed to an apparatus for absorbing thermal energy. An exemplary apparatus for absorbing thermal energy is illustrated in FIG. 1 as an apparatus 100. The FIG. 1 apparatus 100 includes an electronic component 102, a support structure 104 for the electronic component 102, and a thermal energy absorbing material 106. The support structure 104 has a first set of surfaces 108 defining an interior volume 110 containing a plurality of secondary surfaces 112. The thermal energy absorbing material 106 is integrated within the interior volume 110 of the support structure 104 in contact with at least a portion of the secondary surfaces 112 to form a composite structure. The thermal energy absorbing material 106 is in operative thermal communication with the electronic component 102 such that at least a portion of the thermal energy generated by the electronic component flows, via the support structure 104, into the thermal energy absorbing material 106.

Figure 2:
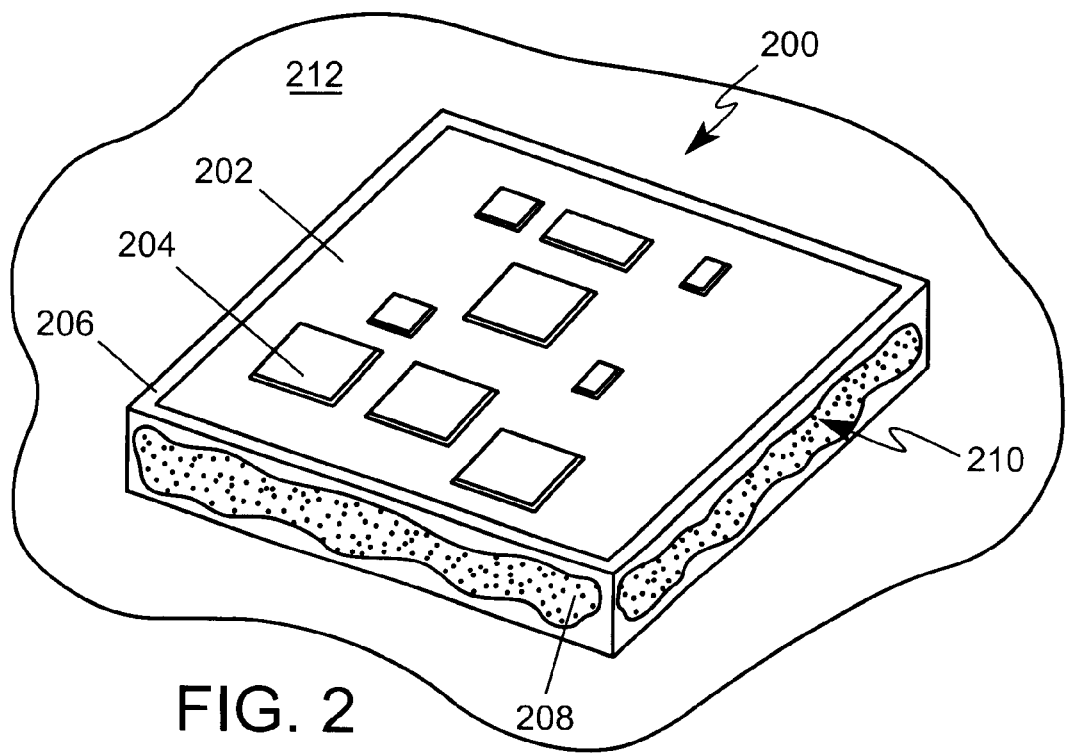
FIG. 2 is another exemplary embodiment of an apparatus for absorbing thermal energy.

FIG. 2 also shows an exemplary embodiment of an apparatus for absorbing thermal energy. In the FIG. 2 apparatus 200, a circuit card 202 with electronic components 204 is in direct contact with a support structure 206 having a thermal energy absorbing material 208 integrated within an interior volume 210.

In exemplary embodiments, the electronic component is one or more of a monolithic millimeter wave integrated circuit (MMIC), a radio frequency (RF) power amplifier, an electronic chip, a circuit card, and a thermal battery. Further, the electronic component can be an element in a electronic assembly. For example, the electronic component can be an element in an inertial measurement unit, a radiating unit, a transmit/receive unit or a thermal reference source.

The electronic component is supported by a support structure. In an exemplary embodiment, the structural support of the thermal energy absorbing apparatus is formed of material that can be a thermal conductor between the substrate with the integrated thermal energy absorbing material and the electronic component supported thereby. For example, the electronic component is affixed to the structural support, is surface mounted to the support structure, is pressure mounted to the support structure, or is otherwise placed in abutting contacting to the support structures such that the electronic component and the support structure are in thermal contact. Thus, the thermal energy absorbing apparatus sees at least a portion of the waste heat generated by the electronic component when the electronic is in operation.

In an exemplary embodiment, the support structure can be formed from a metal-based or ceramic-based material. For example, the support structure can be formed from metal-based materials, such as aluminum, foam aluminum, or copper, or formed from ceramic-based material, such as silicon-carbide-aluminum.

In an exemplary embodiment, the interior volume of the support structure can be continuously connected. However, the support structure can also have an interior volume composed of a plurality of discrete interior volumes, such as a honeycomb arrangement, or can be a permeable sponge-like structure.

For example, a suitable support structure is a foam metal with an interior volume in the form of a continuously connected, duodecahedronal shaped open-cell geometry. Examples of duodecahedronal shaped open-cell geometry foam metals include DUOCEL® materials available from ERG Materials of Oakland, Calif. Duocelan aluminum foam metal with a continuously connected, duodecahedronal shaped open-cell geometry has an interior volume, density and cell size that are independently variable, with available density ranges from 3% to 50% relative to the solid base metal and cell density of 5, 10, 20 and 40 pores per linear inch. Further, duocelan aluminum foam can be cut, turned, milled, drilled, rolled and finished to normal tolerances just like the base aluminum material. Additional manufacturing methods include vacuum- or dipped-brazing, epoxy or adhesion bonding, heat treating, anodizing, and coating, plating and finishing, (e.g., alodine coating or metal plating) and so forth. When brazed to metals, duocelan aluminum foam can form an integral metal-to-metal bond. In addition to aluminum, a duocelan geometry can be practiced in other suitable support structure material, such as vitreous carbon and ceramic-based materials.

Figure 3:
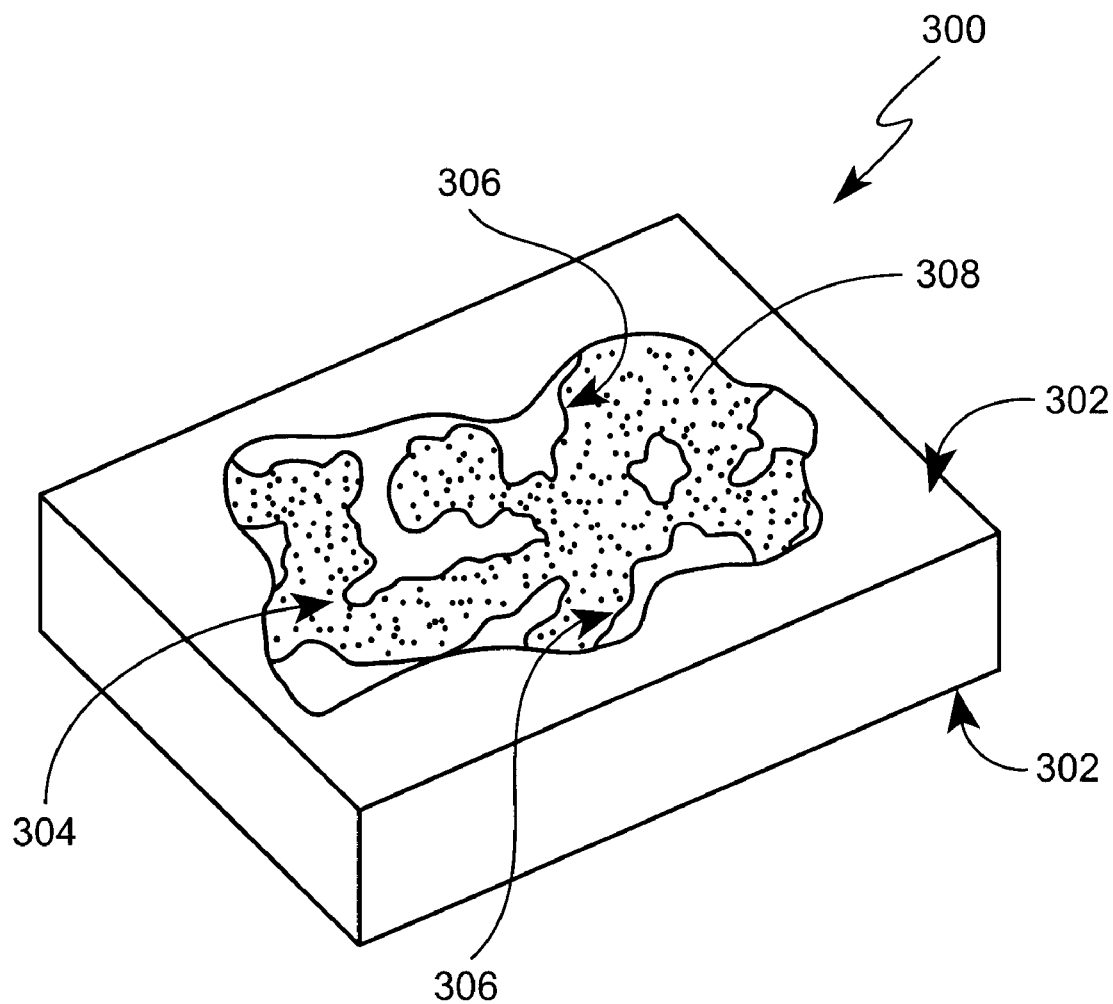
FIG. 3 is a cut-away perspective of an exemplary embodiment of a support structure with an integrated thermal energy absorbing material.

FIG. 3 shows the support structure presented in a cutaway perspective with an integrated thermal energy absorbing material. In the exemplary embodiment represented in FIG. 3, the support structure 300 has a first set of surfaces 302, which define an interior volume 304. The interior volume 304 contains a plurality of secondary surfaces 306 and the thermal energy absorbing material 308 is integrated into the interior volume 304.

The thermal energy absorbing material can be integrated into the support structure of the thermal energy absorbing apparatus by any suitable means. For example, the thermal energy absorbing material can be impregnated into the support structure under pressure or vacuum (e.g., injected by a carrier gas, vacuum dragged, and so forth). Alternatively, the thermal energy absorbing material can have its temperature changed to undergo a phase change to a malleable state (e.g., changed to a liquid or a viscous condition) and then poured, injected, or encapsulated within the interior volume.

In an exemplary embodiment of an apparatus for absorbing thermal energy, a foam aluminum support structure can have a thermal energy absorbing material integrated within the interior volume. This combination provides structural support for the electronic component, (e.g., Microwave Power Amplifier (MPA), RF transmit/receive element, and so forth), while supplementing the thermal capacity of the structural support with a thermal energy absorbing material. Waste heat from the electronic component can be transported via the foam aluminum structure to the thermal energy absorbing material, which absorbs the thermal energy while its temperature rises to the phase change temperature, (e.g., rises to the solid-to-liquid phase change temperature). The thermal energy continues to be absorbed by the thermal energy absorbing material while the phase change occurs with the accompanying endothermic reaction. The phase change temperature and thermal resistance between the electronic component and thermal energy absorbing material fix the temperature of the electronic component, at least during the phase change.

The thermal energy absorbing material can make available additional thermal mass for rapid waste heat absorption. For example, waste heat generated from the electrical load can be absorbed by the phase change material both to increase the temperature of the phase change material as well as to cause the phase change and to thereby limit the temperature transient caused by operation of the electrical load. The increased thermal mass in the form of a phase change material incorporated into the support structure can minimize the impact on the electrical load, passive device, electrical conductor and other associated electronics and electrical circuitry and reduce the incidence of heat related component failure.

An exemplary thermal energy absorbing apparatus has an integrated support structure and thermal energy absorbing material. For example, a support structure for the transmit/receive electronics and/or a support structure for the thermal management structure can be impregnated with a material that has a high specific heat capacity and/or that undergoes a phase change in the temperature range associated with the heat dissipated by the electronic component. In operation, the electronic component generates waste heat. Accordingly, the thermal energy absorbing material absorbs the waste heat thermally conducted from the electronic component to the support structure and raises the temperature of the thermal energy absorbing material. If there is sufficient waste heat, the associated temperature increase in the thermal energy absorbing material can reach the phase change temperature, at which temperature the thermal energy absorbing material remains while continuing to absorb the heat and undergoing the phase change. Thus, the thermal energy absorbing material can contribute to maintaining junction temperatures below critical levels during operation of the electronic component.

The electronic components can be maintained below a maximum surface mounting or junction temperature at which dielectric breakdown, junction failure, and other debilitating failures can occur. For example, for GaAs or SiC materials, the temperature is about 90° C. (e.g., ±10% or greater) and about 120° C. (e.g., ±10% or greater), respectively. Accordingly, the thermal energy absorbing apparatus can operate, (for example, change phase), at or below the maximum temperature for a particular electronic component.

An exemplary thermal energy absorbing material is a phase change material. That is, the phase change material can be any material selected from a group of materials that change phase (e.g., a transform from solid to liquid, liquid to gas, solid to gas, and/or the reverse transformations, over a narrow temperature range while absorbing (endothermic) or producing (exothermic) large amounts of heat energy). In an endothermic reaction, a portion of the absorbed heat corresponds to the absorption of the latent heat of melting or the latent heat of vaporization for a solid-liquid phase change and a liquid to gas phase change, respectively. To mitigate temperature increases of supported electronic components, the thermal energy absorbing material can be any material that undergoes an endothermic reaction within a desired temperature range of the electronic component.

Phase change materials are operative over a wide range of temperatures and include such examples as ice (melting temperature of 32° C. and heat of fusion of 144 BTU/pound) and paraffin wax (melting temperature of 126° F. and heat of fusion of 63 BTU/pound). The general chemical formula for alkanes or paraffins is: $C_nH_{2n+2}$. For thermal energy storage applications, normal-paraffins can be used, due to their higher heat storage capacity. Other physical properties influencing the performance of phase change materials include the solid specific heat (parameter of heat absorbed as a function of temperature in a single phase), solid and liquid thermal conductivity (parameter of heat transport within the material) and solid and liquid specific density (parameter of mass to volume).

Commercial phase change materials can be found in several forms including granulate, powder, paste and microencapsulated (phase change material in small polymer spheres). In general, factors to consider when selecting a phase change material include: ecologically impact; toxicity; chemical inertness to other materials; longevity; stability throughout multiple cycles; ability to be recycled; ease of handling, and narrowness of melting temperature band. Suitable commercial phase change materials include Rubitherm® available from Rubitherm Gmbh of Hamburg Germany, Climsel® available from Climator AB of Skovde, Sweden, and TEAP® available from TEAP Energy of Wangara, Australia.

The thermal energy absorbing material can be located very near the electronic component to effectively absorb waste heat. However, the available volume can be limited due to the high-density packaging of individual electronic components (e.g., the RF transmit/receive elements, microwave power amplifiers, and so forth), that constitute the larger electronic system, (e.g., the RF transmit/receive unit, radiating unit, inertial measurement unit, thermal reference source, and so forth). Therefore, a thermal energy absorbing material with a large heat of fusion and high specific density can be used for electronic components that are densely packaged.

In an exemplary embodiment of an apparatus for absorbing thermal energy, a foam aluminum support structure can have a thermal energy absorbing material integrated with the interior volume. This combination provides structural support for the electronic component (e.g., MPA, RF transmit/receive element, and so forth), while supplementing the thermal capacity of the system. Waste heat from the electronic component can be transported via the foam aluminum structure to the thermal energy absorbing material, which absorbs the thermal energy while its temperature rises to the phase change temperature (e.g., rises to the solid-to-liquid phase change temperature). The thermal energy continues to be absorbed by the thermal energy absorbing material while the phase change occurs with the accompanying endothermic reaction. The phase change temperature and thermal resistance between the electronic component and phase change material fix the temperature of the electronic component, at least during the phase change.

Combining a thermal energy absorbing material with a suitable support structure can make available additional thermal mass (e.g., the thermal energy absorbing material) for rapid electronic component waste heat absorption for short time periods and therefore contribute to maintaining surface mount and junction temperatures below levels that deleteriously impact the performance of electronic components and/or thermally degrade materials during operation of the electronic component. The increased thermal mass in the form of thermal energy absorbing material incorporated into the support structure can minimize and reduce the incidence of the heat related electronic component failure.

In an exemplary embodiment, the apparatus for absorbing thermal energy can be operatively integrated into a thermal management structure, as disclosed in commonly-owned U.S. patent application Ser. No. 10/107,177 en titled "INTEGRATED POWER AND COOLING ARCHITECTURE" filed Mar. 28, 2002, the entire contents of which are hereby incorporated by reference. For example, several MMICs and other electronic parts can be mounted to a circuit board that is structurally supported by an apparatus for absorbing thermal energy. In an exemplary embodiment, the apparatus has a support structure formed from foam aluminum and a thermal energy absorbing material is integrated within the foam aluminum interior volume. In this example, the thermal energy absorbing material is Rubitherm RT80, a phase change material. The waste heat from the MMIC is transported by the foam aluminum structure and is distributed to the thermal energy absorbing material. The solid thermal energy absorbing material absorbs the MMIC generated heat while its temperature rises to the solid to liquid phase change temperature of 79° C. The MMIC generated heat continues to be absorbed while the solid changes to a liquid phase. The phase change temperature and thermal resistance between the MMIC and thermal energy absorbing material contribute to fix the junction temperature of the MMIC and its operating performance. In this example, total heat generated by the electronic components is 45 watts for 30 seconds that can be absorbed within the unit while maintaining a MMIC mounting surface temperature of no more than 95° C. The support structure with integrated thermal energy absorbing material has a volume of 0.40 cubic inches out of 1.42 cubic inches for the total system; the foam aluminum/thermal energy absorbing material weighs 8.65 grams out of 46.3 grams for the total system; and the thermal energy absorbing material absorbs 700 joules of heat out of total heat load of 1350 joules. Thus, the system's thermal mass is increased by 48.7%. Mounting surface temperature without the thermal energy absorbing material integrated within the interior volume of the support structure would be 102° C. (thus exceeding the MMIC mounting surface temperature limit) and the use of solid aluminum for the support structure would increase the weight by 8.7 grams (the invention decreases the system weight by 16%).

In another exemplary embodiment, an RF transmit/receive (T/R) module is structurally supported by ERG foam aluminum. The T/R module can comprise heat dissipating electronic components (such as a MMIC). The foam aluminum has the Rubitherm RT80 phase change material integrated within the foam aluminum interior volume. The waste heat from the T/R module is transported by the foam aluminum structure and is distributed to the thermal energy absorbing material. The solid thermal energy absorbing material absorbs the generated heat while its temperature rises to the solid to liquid phase change temperature of 79° C. The generated heat continues to be absorbed while the solid changes to a liquid phase.

The phase change temperature and thermal resistance between the MMIC and thermal energy absorbing material fix the junction temperature of the MMIC and its operating performance. Total power generated by the electronic components is 22.5 watts for 30 seconds that can be absorbed within the unit while maintaining a MMIC mounting surface temperature of 95° C. The structural foam with thermal energy absorbing material filled voids has a volume of 0.20 cubic inches out of 0.71 cubic inches for the total system. The foam aluminum/thermal energy absorbing material weight is 4.33 grams out of 23.2 grams for the total system. The thermal energy absorbing material absorbs 350 joules of heat out of 675 joules total heat load (the invention increases the system thermal mass by 48.7%). Mounting surface temperature without the thermal energy absorbing material integrated within the interior volume of the support structure would be 102° C. (thus exceeding the MMIC mounting surface temperature limit) and the weight would increase by 8.7 grams (the invention decreases the system weight by 16%).

In an additional exemplary embodiment, a mobile phone has an electronic component, one of which might be an RF power amplifier. When in stand-by mode, quiescent heat dissipation is very low and is dissipated to the surrounding environment with minimal increase in overall component temperature. In other words, the ambient thermal energy loss rate approximates the quiescent thermal energy generation rate. However, when transmitting, the waste heat from the electronic components can be very high and more thermal energy is absorbed locally to the electronic components. The electronic component is structurally supported by foam aluminum having integrated phase change material (PCM) (e.g., paraffin wax blended with boron nitride) within the interior volume. Thus, the waste heat during transmission is transported into the foam aluminum structure where it is distributed to the thermal energy absorbing material while still limiting the maximum surface mount temperature. In this exemplary embodiment, the solid thermal energy absorbing material absorbs the heat while its temperature rises to the solid to liquid phase change temperature of 52.4° C. The heat continues to be absorbed while some of the solid changes phase to the liquid state. During subsequent quiescent operation and/or powered off mode, any liquid thermal energy absorbing material will revert to a solid by an exothermic process where excess heat is conducted and naturally dissipated to the surrounding environment. The exothermic process can be such that ambient losses can accommodate the thermal energy to avoid raising surface mount temperatures.

In another exemplary embodiment, a thermal battery provides electrical power to an electronic component, such as in a military application, an airborne platform, and so forth. The chemical reaction within the battery produces electrical energy and gives off large amounts of waste heat. To keep the battery temperature to less than 300° C. (an efficient operating temperature for this system), the battery walls and structure supporting the required chemicals are made of foam aluminum. A thermal energy absorbing material, such as Rubitherm RT110 PCM, is integrated with the interior volume of the foam aluminum. The activated battery waste heat is transported into the foam aluminum support structure where it is distributed to the thermal energy absorbing material. The solid thermal energy absorbing material absorbs the heat while its temperature rises to the solid to liquid phase change temperature of 110° C. The heat continues to be absorbed while the solid changes to liquid state.

In another exemplary embodiment, a thermal reference source (TRS) maintains the temperature of a conditioned surface at ±0.1–0.5° C. of a desired fixed temperature for Forward Looking Infrared (FLIR) electronic referencing to set signal gain and level. The TRS can use a thermal electric device (TE) to temperature condition the surface resulting in 3.5 watts of waste heat generated on the TE mounting surface (opposite the temperature conditioned surface). Typically, the surface conditioning lasts 120 seconds with long time periods (typically one hour) of quiescent, low or no heat dissipating activity. TE's are able to maintain a temperature-conditioned surface within ±30° C. of the mounting surface temperature. Quiescent heat dissipation is naturally dissipated to the surrounding environment. However, when the TE device is temperature conditioning, the heat dissipation is very high and must be absorbed locally. The TE is structurally supported by foam aluminum with a thermal energy absorbing material within an interior 0.25 cubic inch volume that forms the mounting surface. Thermal energy absorbing material, e.g., paraffin wax blended with boron nitride, is integrated within the foam aluminum interior volume. The waste heat is transported into the foam aluminum support structure where it is distributed to the thermal energy absorbing material. The solid thermal energy absorbing material absorbs the heat while its temperature rises to the solid to liquid phase change temperature of 52.4° C. The heat continues to be absorbed while some of the solid changes to liquid state. The TE performance, phase change temperature and thermal resistance between the TE mounting surface and thermal energy absorbing material fix the conditioned surface temperature, which may be as low as 25° C. During quiescent operation and/or powered off mode, any liquid phase thermal energy absorbing material will revert to a solid phase by an exothermic process where excess heat is conducted and naturally dissipated to the surrounding environment. The whole cycle can then be repeated. This configuration, relative to an exemplary block of solid aluminum, can provide a 50% weight reduction and better TE performance. The temperature-conditioned surface operating point is 50° C. for an aluminum block versus 25° C. for the thermal energy absorbing apparatus.

In another embodiment, a 6-inch-by-6-inch (6×6) circuit card can operate with a very high waste heat dissipation (e.g., 18 watts) for a fixed length of time (e.g., approximately 300 seconds). The circuit card attached by mounting technologies, such as bonding, thermal paste, and so forth directly to a structural support, such as foam aluminum with thermal energy absorbing material integrated within the interior volume has a thickness of 0.085 inches. Waste heat from the circuit card is transported through the foam aluminum structure from a contact location and is distributed to the thermal energy absorbing material. The solid thermal energy absorbing material absorbs the heat and the temperature rises to the solid to liquid phase change temperature. The heat continues to be absorbed while the solid changes to liquid. The circuit card temperature rise will be approximately 15° C. A traditional method is to use a solid aluminum sheet that absorbs the heat and/or transports the heat to some ultimate heat sink has a calculated temperature rise of 41° C.

In an exemplary method of controlling a temperature of an electronic component, an electronic component is mounted on a support structure in thermal communication with a thermal energy absorbing material integrated into an interior volume of the support structure. At least a portion of a thermal load from the electronic component is transported to the thermal energy absorbing material, and the portion of the thermal load is absorbed with the thermal energy absorbing material while undergoing an endothermic reaction during a phase change of the material, such that a temperature of the electronic component is maintained below a mounting surface temperature.

In an exemplary method, the thermal energy absorbing material can be selected to have a phase change temperature less than the mounting surface temperature.

In another exemplary method, the electronic component can be mounted directly to the support structure. Further and as shown in the exemplary embodiment of FIG. 2, the apparatus for absorbing thermal energy 200 can be mounted to an airborne platform 212.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. An apparatus for absorbing thermal energy, the apparatus comprising:

an electronic component;

a support structure for the electronic component, the support structure having a first set of surfaces defining an interior volume containing a plurality of secondary surfaces, the interior volume composed of a plurality of discrete interior volumes; and a thermal energy absorbing material integrated within the interior volume, in contact with at least a portion of the secondary surfaces to form a composite structure, the thermal energy absorbing material being in operative thermal communication with the electronic component such that at least a portion of the thermal energy generated by the electronic component flows, via the support structure, into the thermal energy absorbing material.

2. The apparatus of claim 1, wherein the electronic component is one or more of a monolithic millimeterwave integrated circuit, a radio frequency power amplifier, an electronic chip, a circuit card, and a thermal battery.

3. The apparatus of claim 1, wherein the electronic component is an element in an inertial measurement unit, a radiating unit, a transmit/receive unit or a thermal reference source.

4. The apparatus of claim 1, wherein the support structure is formed from a metal-based or a ceramic-based material.

5. The apparatus of claim 4, wherein the metal-based material is aluminum, foam aluminum, or copper.

6. The apparatus of claim 4, wherein the ceramic-based material is siliconcarbide-aluminum.

7. The apparatus of claim 1, wherein the portion of the thermal energy is a waste heat generated by the electronic component.

8. The apparatus of claim 1, wherein the interior volume is continuously connected.

9. The apparatus of claim 1, wherein the support structure is a foam metal with an interior volume in the form of a continuously connected, duodecahedronal shaped open-cell geometry.

10. The apparatus of claim 1, wherein the thermal energy absorbing material is in a solid phase at room temperatures and undergoes an endothermic reaction while changing phase to a liquid phase or to a gaseous phase.

11. The apparatus of claim 1, wherein the thermal energy absorbing material is selected from the group consisting of a phase change material, water, ice, wax, and wax blended with boron nitride.

12. The apparatus of claim 1, wherein a phase change temperature of the thermal energy absorbing material and a thermal resistance between the electronic component and the thermal energy absorbing material together fix a junction temperature of the electronic component.

13. The apparatus of claim 1, wherein the thermal energy absorbing material is integrated with the interior volume such that an expansion volume is present in the interior volume sufficient to accommodate an increase in volume of the thermal energy absorbing material as thermal energy is absorbed or the material changes phase.

14. The apparatus of claim 1, wherein the electronic component is mounted to at least one of the first set of surfaces.

15. The apparatus of claim 14, wherein the electronic component is mounted directly to the support structure.

16. The apparatus of claim 1, wherein the apparatus is operatively mounted in an airborne platform.

17. The method of claim 1, wherein the support structure is a honeycomb structure, a permeable sponge structure, a foam metal or a foam ceramic.

18. A method of controlling a temperature of an electronic component, the method comprising:

mounting an electronic component on a support structure in thermal communication with a thermal energy absorbing material integrated into an interior volume of the support structure, the interior volume composed of a plurality of discrete interior volumes;

transporting at least a portion of a thermal load from the electronic component to the thermal energy absorbing material; and absorbing the portion of the thermal load with the thermal energy absorbing material while undergoing an endothermic reaction during a phase change of the material, such that a temperature of the electronic component is maintained below a maximum junction temperature of the electronic component.

19. The method of claim 18, wherein the electronic component is mounted directly to the support structure.

20. The method of claim 18, comprising selecting the thermal energy absorbing material to have a phase change temperature less than the mounting surface temperature.

21. The method of claim 18, wherein the support structure is a honeycomb structure, a permeable sponge structure, a foam metal or a foam ceramic.

* * * * *

UNITED STATES PATENT AND TRADEMARK OFFICE
CERTIFICATE OF CORRECTION

PATENT NO. : 6,621,702 B2
DATED : September 16, 2003
INVENTOR(S) : J. Michael Elias et al.

It is certified that error appears in the above-identified patent and that said Letters Patent is hereby corrected as shown below:

<u>Column 9,</u>
Line 29, delete "siliconcarbide-aluminum" and insert therefor -- silicon-carbide-aluminum --.

Signed and Sealed this

Thirteenth Day of January, 2004

JON W. DUDAS
*Acting Director of the United States Patent and Trademark Office*